US006479018B2

(12) United States Patent
Collins et al.

(10) Patent No.: US 6,479,018 B2
(45) Date of Patent: Nov. 12, 2002

(54) DETECTION OF A GASEOUS SUBSTANCE EMANATING FROM A LAYER OF POLYMERIC COMPOSITION

(75) Inventors: James Patrick Collins, Shelburne, VT (US); Laird Chandler MacDowell, Jeffersonville, VT (US); Wayne Martin Moreau, Wappinger, NY (US); Michael Santarelli, Allentown, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/761,470

(22) Filed: Jan. 16, 2001

(65) Prior Publication Data

US 2001/0001370 A1 May 24, 2001

Related U.S. Application Data

(62) Division of application No. 09/369,088, filed on Aug. 5, 1999.

(51) Int. Cl.[7] .......................... G01N 7/00; G01N 33/00; G01N 31/00; G01N 27/00; G01N 21/00
(52) U.S. Cl. ..................... 422/83; 422/56; 422/57; 422/80; 422/86; 422/87; 422/88; 422/91; 436/100; 436/101; 436/102; 436/181; 436/3
(58) Field of Search ............................ 422/56, 57, 80, 422/86, 87, 88, 91, 83; 436/100, 101, 102, 181, 3

(56) References Cited

U.S. PATENT DOCUMENTS

| 5,240,812 A | 8/1993 | Conley et al. |
| 5,260,163 A | 11/1993 | Nebe et al. |
| 5,275,689 A | 1/1994 | Felten et al. |
| 5,310,627 A | 5/1994 | Hirz et al. |
| 5,326,675 A | 7/1994 | Niki et al. |
| 5,350,485 A | 9/1994 | Shiraishi et al. |
| 5,401,607 A | 3/1995 | Takiff et al. |
| 5,441,850 A | 8/1995 | Marshall et al. |
| 5,514,519 A | 5/1996 | Neckers |
| 5,631,118 A | 5/1997 | Gaudiana et al. |
| 5,664,522 A | 9/1997 | Vogel et al. |
| 5,712,078 A * | 1/1998 | Huang et al. ............ 430/270.1 |
| 5,750,312 A | 5/1998 | Chandross et al. |
| RE35,821 E | 6/1998 | Niki et al. |
| 5,853,952 A | 12/1998 | Ushirogouchi et al. |
| 6,020,107 A | 2/2000 | Niiyama et al. |
| 6,054,254 A | 4/2000 | Sato et al. |

OTHER PUBLICATIONS

Zhang, P. Linda et al., "Acid diffusion through polymer films", Proc. SPIE–Int. Soc. Opt. Eng. (1997), 3049(Advances in Resist Technology and Processing XIV), 898–909.*

Stewart, Michael D. et al., "Measurement of Acid Diffusivity in Thin Polymer Filsm Above and Below Tg", Polym. Mater. Sci. Eng. (1999), 81, 58–59.*

* cited by examiner

Primary Examiner—Jill Warden
Assistant Examiner—Jennine Brown
(74) Attorney, Agent, or Firm—Schmeiser, Olsen & Watts; William D. Sabo

(57) ABSTRACT

Detection of an evolving or diffusing gaseous substance emanating from an irradiated or thermolyzed layer of polymeric composition in semiconductor processing or similar processes is disclosed. The evolving or diffusing gaseous substance is detected by spatially disposing from the irradiated or thermolyzed layer a detector layer that includes a compound having leaving groups that are sensitive to the gaseous substance being detected.

5 Claims, 2 Drawing Sheets

DETECTION OF A GASEOUS SUBSTANCE EMANATING FROM A LAYER OF POLYMERIC COMPOSITION

This application is a divisional of Ser. No. 09/369,088, filed on Aug. 5, 1999.

BACKGROUND OF THE INVENTION

1. Technical Field

The invention relates generally to semiconductor processing, and more specifically, to detecting gaseous substances emanating from material used in semiconductor processing.

2. Background Art

In semiconductor processing, certain materials, such as resists of polymeric composition, may produce and emit a gaseous substance when irradiated or thermolyzed. If the gaseous substance is corrosive and/or present in a certain quantity, the substance may be damaging to the materials surrounding the resist. For example, when exposed to ultraviolet light, a negative resist used in masking a semiconductor device may produce and emit minute quantities of hydrochloric acid. Hydrochloric acid, when reaching a certain strength and when within a particular proximity to the lens in a stepper chamber, may corrode the magnesium coatings on the lens, thus damaging the lens. Although the quantity of the hydrochloric acid emitted from the resist may be minute, an accumulation of acid after a period of time may eventually accumulate to a corrosive amount.

Within the technology of lithography, acids may be detected on an exposed film or surface through the use of an indicating dye, which is in contact with the exposed film or surface. Examples of this type of acid detection are found in the following U.S. Patents: U.S. Pat. No. 5,441,850, "Imaging Medium and Process for Producing an Image," issued to Marshall et al.; U.S. Pat. No. 5,514,519, "Production of Three-Dimensional Objects," issued to Neckers; and U.S. Pat. No. 5,631,118, "Imaging Medium," issued to Gaudiana et al.

Although acids can be detected on a surface as described in the above-referenced patents, the patents do not disclose, nor recognize the need for, the detection of acids that are in a gaseous state, and the detection of such gaseous acids at a location that is spatially disposed from the exposed film or surface. Also, the above-referenced patents do not take in account the corrosive and cumulative effects of gaseous substances involved in semiconductor processes. Indeed, most acids detected in lithographical systems and tests therefor are not relevant in semiconductor processes.

SUMMARY OF THE INVENTION

It is thus an advantage of the present invention to provide a method for detecting gaseous substances emanating from material used in semiconductor processing.

The advantages of the present invention are realized by a method of detecting an evolving or diffusing gaseous substance emanating from an irradiated or thermolyzed layer of polymeric composition. The method includes spatially disposing from the irradiated or thermolyzed layer a detector layer which includes a compound having leaving groups that are sensitive to the substance being detected. In the preferred embodiment, the evolving or diffusing gaseous substance is confined through the irradiated or thermolyzed layer of polymeric composition, the detector layer and non-reactive spacer elements.

Another advantage of the present invention is detecting the quantity of the evolving or diffusing gaseous substance emanating from the irradiated or thermolyzed layer of polymeric composition.

Generally, the present invention provides a method comprising the steps of: providing a layer of polymeric composition; providing a detector layer having leaving groups that are sensitive to predetermined gaseous substances; spatially disposing said layer of polymeric composition from said detector layer; and detecting evolving or diffusing said gaseous substances emanating from said layer of polymeric composition with said leaving groups of said detector layer.

The present invention additionally provides an apparatus comprising: a layer of polymeric composition; a detector layer having leaving groups that are sensitive to predetermined gaseous substances for detecting evolving or diffusing said gaseous substances emanating from said layer of polymeric composition; and a non-reactive spacer element for spatially disposing said layer of polymeric composition from said detector layer.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE DRAWINGS

Figure 1:
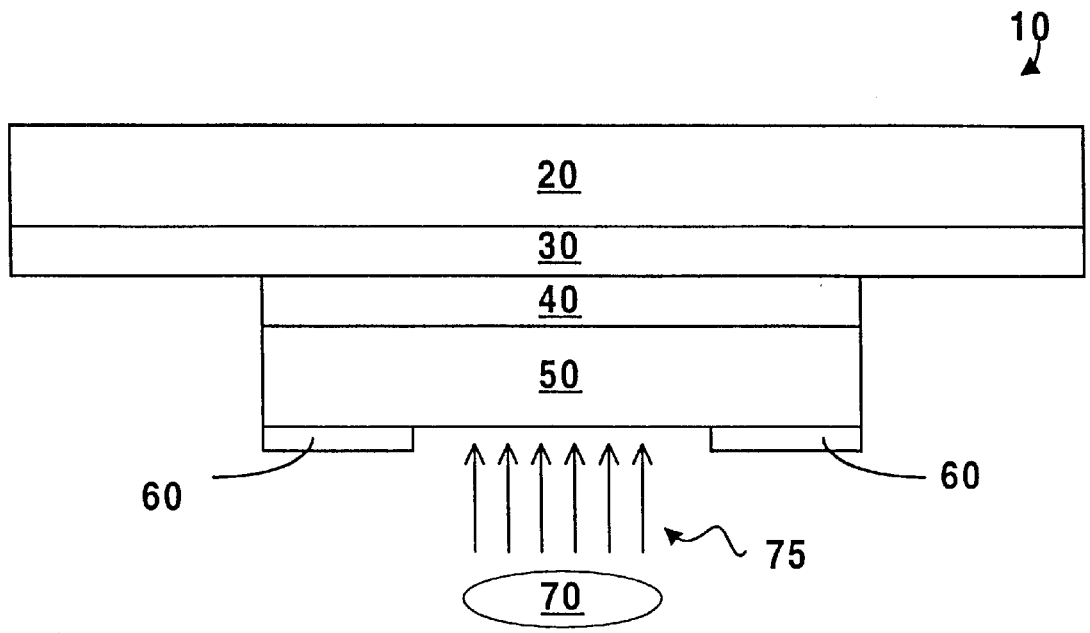
FIG. 1 is a cross-section of a test section for a semiconductor component in accordance with a first embodiment of the present invention.

The features and advantages of the present invention are illustrated in detail in the accompanying drawings, wherein like reference numerals refer to like elements throughout the drawings. Although the drawings are intended to illustrate the present invention, the drawings are not necessarily drawn to scale.

Referring to FIG. 1, there is illustrated a cross-sectional diagram of a test section 10 for a semiconductor component including a substrate surface 20, detector layer 30, polymeric composition layer 40, translucent layer 50, masking element 60 and energy source 70 in accordance with a first embodiment of the present invention.

As shown in FIG. 1, detector layer 30 is preferably located between surface 20 and polymeric composition layer 40. Alternately, although not shown, polymeric composition layer 40 may be located adjacent to substrate surface 20, and thus between detector layer 30 and substrate surface 20. Substrate surface 20 represents a surface of a test wafer in semiconductor fabrication. Polymeric composition layer 40 may be any layer, such as a resist (negative or positive), used in fabricating wafers, that may emit gaseous substances when irradiated or thermolyzed.

Detector layer 30 comprises a compound having leaving groups that are sensitive to the evolving or diffusing gaseous substance emanating from the irradiated or thermolyzed polymeric composition layer 40. An example of detector layer 30 includes, but is not limited to, a polymer that has acid sensitive groups, such as ketals attached to the phenol portion of polyhydroxystyrene as described in U.S. Pat. No. 5,712,078, which is herein incorporated by reference. Other examples of acid-sensitive groups are found in the following U.S. Patents, which are herein incorporated by reference: U.S. Pat. No. 5,585,220; U.S. Pat. No. 5,492,793; U.S. Pat. No. 4,491,628; and U.S. Pat. No. 5,759,750.

Gaseous substances may include corrosive acids such as trifluoromethane sulfonic acid ($CF_3SO_3H$) or hydrochloric acid, or similar substances that may affect semiconductor processing.

Polymeric composition layer 40 is adjacent to translucent layer 50, which is masked by masking element 60. Translucent layer 50 is non-reactive to energy waves 75. Translucent layer 50 may be a glass plate (e.g., quartz) or a structure of similar composition that allows the energy waves 75 from energy source 70 to penetrate polymeric composition layer 40 in selected areas as indicated by masking element 60. Masking element 60 may be tape or any other element that can block out energy waves 75. Energy source 70 may include, but is not limited to, a thermal source or a light source. Polymeric composition layer 40 may then be a thermo-acid regeneration resist (in conjunction with energy source 70 being a thermal source) or a radiation-sensitive resist (in conjunction with energy source 70 being a light source) depending upon the desired effects. Although only one test section is shown and described in the figures, it is to be understood that many different test sections could be present, utilizing different resists and energy sources, which may be tested simultaneously.

Figure 2:
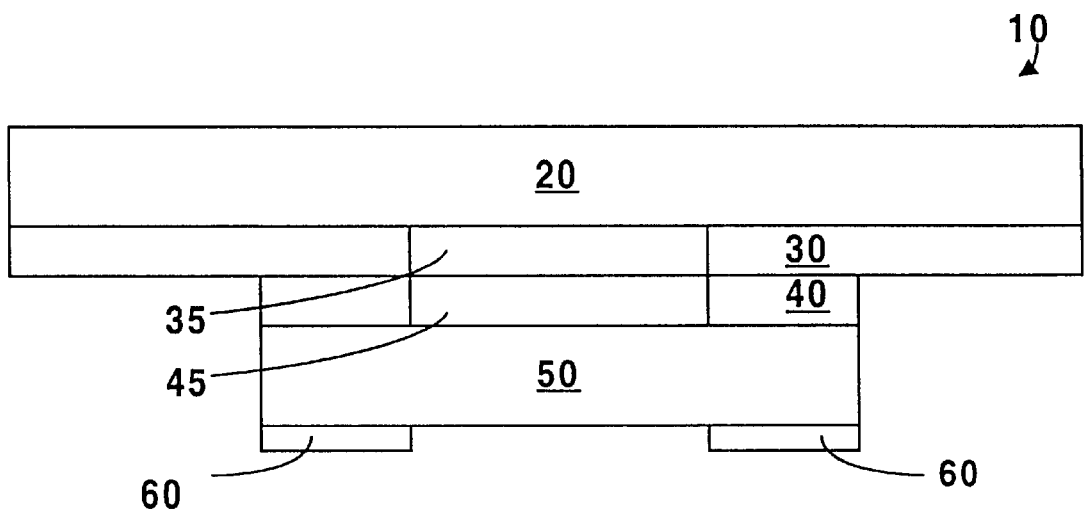
FIG. 2 is a cross-section of an irradiated or thermolyzed layer and resulting detector layer of FIG. 1.

FIG. 2 illustrates the transformation of the detector layer 30 and polymeric composition layer 40 after the polymeric composition layer 40 is selectively irradiated or thermolyzed 45. Acid-sensitized leaving groups 35 indicate on detector layer 30 whether or not evolving or diffusing gaseous substances have emanated from irradiated/thermolyzed polymeric composition layer 45. As previously described, even a small amount of gaseous substance could be cumulatively damaging to adjacent components and devices (e.g., the magnesium coatings on a lens) if the substrate surface 20 were to be moved back and forth under a stepper table. Thus, different exposure times may be used to ascertain the quantity of gaseous substance being emitted over time.

Thus, one of the advantages of the first embodiment of the present invention is the detection of emanating or diffusing gaseous substances and the quantity thereof. The same embodiment may also be used as a low-cost method for etching a print image onto a substrate or similar element. That is, the polymeric composition layer 40 could be a patterned layer that would emit a gaseous substance, which in turn would penetrate detector layer 30, creating a contact print image on substrate surface 20.

Figure 3:
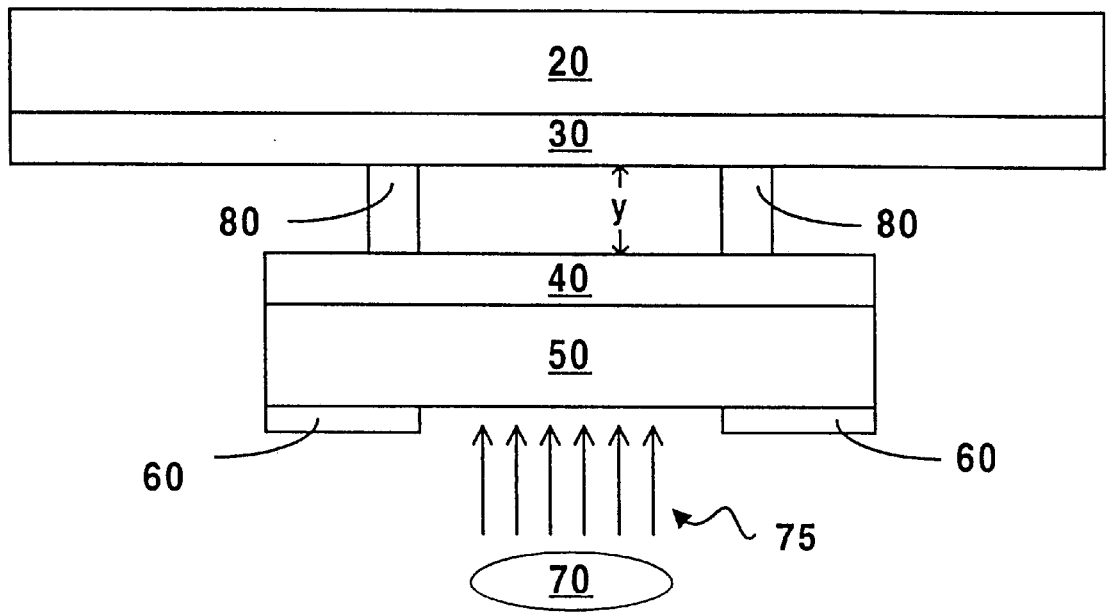
FIG. 3 is a cross-section of a test section for a semiconductor component in accordance with the preferred embodiment of the present invention.
Figure 4:
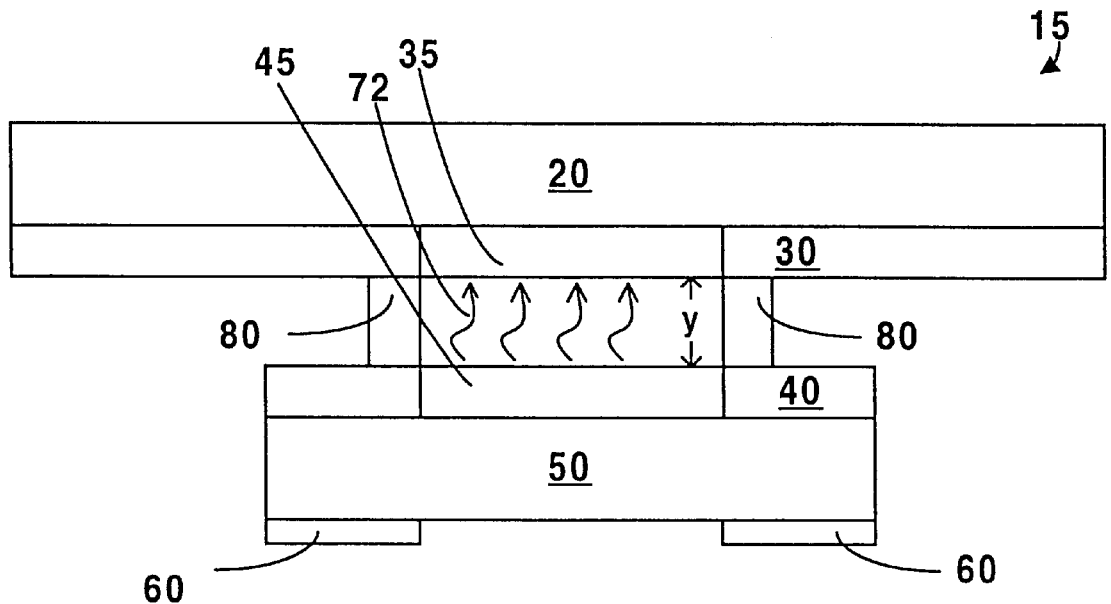
FIG. 4 is a cross-section of an irradiated or thermolyzed layer and resulting detector layer of FIG. 3.

FIGS. 3 and 4 illustrate the preferred embodiment 15 of the present invention. As can be seen, FIG. 3 is similar to FIG. 1, except that the polymeric composition layer 40 and the detector layer 30 are separated with non-reactive spacer element 80 by a spatial distance "y." That is, the height of spacer element 80 determines spatial distance "y." Spacer element 80, which is not radiation-sensitive or thermosensitive, confines the gaseous substance to an area between polymeric composition layer 40 and detector layer 30. Some examples of non-reactive spacer elements include O-rings or similar structures. Similar to FIG. 1, FIG. 3 shows a detector layer 30 between substrate surface 20 and polymeric composition layer 40. Polymeric composition layer 40 is adjacent to translucent layer 50, which is masked by masking element 60. One advantage of separating polymeric composition layer 40 from detector layer 30 is the ability to test how far any gaseous substances emanate from polymeric composition layer 40, and thus how much impact those gaseous substances would have on the surroundings area at various spatial distances.

FIG. 4 illustrates the transformation of the detector layer 30 and polymeric composition layer 40 into an irradiated/thermolyzed polymeric composition layer 45 after the polymeric composition layer 40 is selectively irradiated or thermolyzed. Acid-sensitized leaving groups 35 indicate on detector layer 30 whether or not evolving or diffusing gaseous substances 72 have emanated from the irradiated/thermolyzed polymeric composition layer 45. As previously detailed, even a small amount of gaseous substance 72 could be damaging through cumulative effects of contamination. Thus, the exposure time of polymeric composition layer 40 may affect its usability.

Varying spatial distances "y" determine how far the diffusing or evolving gaseous substances 72 emanate from polymeric composition layer 40. For example, if "y" is less than 1 millimeter (mm), an image may show up on detector layer 30. As "y" increases, the image will decrease in strength until at a particular distance, e.g., 12 mm, there is no image at all. For this example, then, depending on the exposure time of polymeric composition layer 40, the polymeric composition layer 40 may only be used when "y" is approximately 9 mm or greater without adversely affecting substrate surface 20. The present invention, therefore, can be used to determine both the quantity of the gaseous substance 72 and the usability of the polymeric composition layer 40 through both the spatial distance "y" and the exposure time.

Thus, the present invention allows for the detection of an evolving or diffusing gaseous substance from a layer of polymeric composition by using leaving groups of a detector layer that is spatially disposed from the polymeric composition layer.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An apparatus comprising:

a layer of polymeric composition;

a debtor layer having leaving groups that indicate an amount of evolving or diffusing gaseous substances emanating from said later of polymeric composition; and a non-reactive spacer element for spatially disposing said layer of polymeric composition from said detector layer, wherein said non-reactive spacer element has a height that minimizes the amount of said evolving or diffusing gaseous substances detected in said detector layer, and wherein said height is no greater than a maximum height above which said evolving or diffusing gaseous substances are not detectable in said detector layer.

2. The apparatus of claim 1, wherein said non-reactive spacer element contains said gaseous substances in an area.

3. The apparatus of claim 1, wherein said detector layer is an acid-sensitive layer.

4. The apparatus of claim 1, wherein said gaseous substances are corrosive.

5. The apparatus of claim 1, wherein said layer of polymeric composition is a resist used in semiconductor processing.

* * * * *